(12) United States Patent
Huang et al.

(10) Patent No.: US 12,326,375 B2
(45) Date of Patent: Jun. 10, 2025

(54) PRESSURE-SENSITIVE STRUCTURE AND ELECTRONIC DEVICE

(71) Applicant: SHENZHEN NEW DEGREE TECHNOLOGY CO., LTD., Guangdong (CN)

(72) Inventors: Tuoxia Huang, Guangdong (CN); Jinbo Yu, Guangdong (CN)

(73) Assignee: SHENZHEN NEW DEGREE TECHNOLOGY CO., LTD., Shenzhen (CN)

( * ) Notice: Subject to any disclaimer, the term of this patent is extended or adjusted under 35 U.S.C. 154(b) by 345 days.

(21) Appl. No.: 17/912,832

(22) PCT Filed: Feb. 8, 2021

(86) PCT No.: PCT/CN2021/075915
§ 371 (c)(1),
(2) Date: Sep. 19, 2022

(87) PCT Pub. No.: WO2021/185003
PCT Pub. Date: Sep. 23, 2021

(65) Prior Publication Data
US 2023/0144931 A1    May 11, 2023

Related U.S. Application Data

(60) Provisional application No. 63/064,086, filed on Aug. 11, 2020, provisional application No. 62/992,000, filed on Mar. 19, 2020.

(51) Int. Cl.
*G01L 1/22* (2006.01)
*G01L 1/14* (2006.01)
(Continued)

(52) U.S. Cl.
CPC ............ *G01L 1/2293* (2013.01); *G01L 1/148* (2013.01); *G01L 1/2262* (2013.01);
(Continued)

(58) Field of Classification Search
CPC ..... G01L 1/2293; G01L 1/148; G01L 1/2262; G01L 1/2281; G01L 1/18; H01L 28/20;
(Continued)

(56) References Cited

U.S. PATENT DOCUMENTS 3,451,030 A * 6/1969 Garfinkel .............. G01L 1/2293
257/772
4,556,115 A    12/1985 Lockery et al.
(Continued)

FOREIGN PATENT DOCUMENTS

CN         1049718 A     3/1991
CN         1460846 A    12/2003
(Continued)

OTHER PUBLICATIONS

Office Action issued in CN202180018343.9, dated Mar. 7, 2024, 7 pages.
(Continued)

*Primary Examiner* — David J Bolduc

(57) ABSTRACT

A pressure-sensitive structure and an electronic device are provided in the present application, in the structure of the pressure-sensitive structure, a first elastic carrier is arranged on a first mounting surface of the substrate, a semiconductor film is arranged on the first elastic carrier. When the substrate is deformed, the first elastic carrier is bent and deformed with a deformation of the substrate, a strain signal is amplified by the substrate, so that the semiconductor film can detect an amount of bending deformation of the substrate, and a signal measurement circuit of the semiconductor film is configured to output a recognizable electric signal.

(Continued)

The pressure-sensitive structure is a sensor structure being small in size, being high in precision, and being high in reliability and sensitivity. The pressure-sensitive structure is attached to a panel or a side frame of the electronic device.

20 Claims, 7 Drawing Sheets

(51) Int. Cl.
  *H10D 1/43*      (2025.01)
  *H10D 1/47*      (2025.01)
  *G01L 1/18*      (2006.01)
  *G06F 3/041*     (2006.01)
(52) U.S. Cl.
  CPC ............ *G01L 1/2281* (2013.01); *H10D 1/43* (2025.01); *H10D 1/47* (2025.01); *G01L 1/18* (2013.01); *G06F 3/041* (2013.01); *G06F 2203/04105* (2013.01)
(58) Field of Classification Search
  CPC ................ H01L 29/8605; G06F 3/041; G06F 2203/04105
  See application file for complete search history.

(56) References Cited

U.S. PATENT DOCUMENTS

| | | | | |
|---|---|---|---|---|
| 4,658,233 | A * | 4/1987 | Uchida | G01L 1/2262 73/726 |
| 4,739,381 | A * | 4/1988 | Miura | G01L 9/0052 257/469 |
| 4,771,638 | A | 9/1988 | Sugiyama et al. | |
| 6,729,187 | B1 * | 5/2004 | Gregory | H01C 7/06 73/765 |
| 8,056,421 | B2 * | 11/2011 | Sumigawa | G01L 5/0047 73/777 |
| 2006/0207339 | A1 * | 9/2006 | Sumigawa | G01B 7/18 73/777 |
| 2006/0216848 | A1 * | 9/2006 | Tanie | G01L 1/2293 438/50 |
| 2007/0151356 | A1 * | 7/2007 | Sumigawa | G01L 5/0047 73/777 |
| 2007/0186677 | A1 * | 8/2007 | Zunino III | G01M 5/0091 73/849 |
| 2008/0072684 | A1 * | 3/2008 | Baniecki | G01L 1/148 73/777 |
| 2009/0145235 | A1 * | 6/2009 | Gregory | G01L 1/2293 73/726 |
| 2010/0307255 | A1 | 12/2010 | Totokawa et al. | |
| 2011/0226069 | A1 * | 9/2011 | Kim | G01L 1/2293 29/25.01 |
| 2014/0220327 | A1 * | 8/2014 | Adib | C03C 17/3435 428/217 |
| 2015/0020601 | A1 * | 1/2015 | Miyajima | G01L 1/2281 73/777 |
| 2015/0068315 | A1 | 3/2015 | Davis et al. | |
| 2015/0143915 | A1 * | 5/2015 | Hwang | G01L 5/0057 73/763 |
| 2016/0299598 | A1 * | 10/2016 | Yoon | G06F 3/0447 |
| 2017/0191884 | A1 * | 7/2017 | Vosgueritchian | G01L 1/2287 |
| 2018/0145266 | A1 * | 5/2018 | Matsui | H10K 85/6574 |
| 2019/0041281 | A1 * | 2/2019 | Li | G06F 3/045 |
| 2020/0309617 | A1 * | 10/2020 | Mukai | G01L 1/2262 |
| 2020/0309618 | A1 * | 10/2020 | Mukai | G01L 5/161 |
| 2020/0378848 | A1 * | 12/2020 | Sugino | G01L 1/2293 |
| 2021/0328164 | A1 * | 10/2021 | Takeya | G01P 15/124 |
| 2021/0405781 | A1 * | 12/2021 | Li | H10K 59/8791 |

FOREIGN PATENT DOCUMENTS

| | | |
|---|---|---|
| CN | 101044382 A | 9/2007 |
| CN | 101046368 A | 10/2007 |
| CN | 201215517 Y | 4/2009 |
| CN | 101526411 A | 9/2009 |
| CN | 101566514 A | 10/2009 |
| CN | 101639391 A | 2/2010 |
| CN | 101719482 A | 6/2010 |
| CN | 101807531 A | 8/2010 |
| CN | 101815933 A | 8/2010 |
| CN | 202255734 U | 5/2012 |
| CN | 202710236 U | 1/2013 |
| CN | 103712721 A | 4/2014 |
| CN | 104897333 A | 9/2015 |
| CN | 204652340 | 9/2015 |
| CN | 105021341 A | 11/2015 |
| CN | 105021347 A | 11/2015 |
| CN | 105203019 A | 12/2015 |
| CN | 105224129 | 1/2016 |
| CN | 105895540 A | 8/2016 |
| CN | 105895587 A | 8/2016 |
| CN | 205843877 U | 12/2016 |
| CN | 106301324 | 1/2017 |
| CN | 106768524 A | 5/2017 |
| CN | 106855756 | 6/2017 |
| CN | 206930343 U | 1/2018 |
| CN | 108027290 A | 5/2018 |
| CN | 108037844 | 5/2018 |
| CN | 108365021 A | 8/2018 |
| CN | 207964135 U | 10/2018 |
| CN | 108917587 A | 11/2018 |
| CN | 109238525 A | 1/2019 |
| CN | 109399556 A | 3/2019 |
| CN | 109781314 A | 5/2019 |
| CN | 109844447 A | 6/2019 |
| CN | 110174198 A | 8/2019 |
| CN | 209264161 A | 8/2019 |
| CN | 110806172 A | 2/2020 |
| CN | 111174687 A | 5/2020 |
| EP | 0 195 232 | 9/1986 |
| JP | 2017003365 A | 9/1986 |
| JP | 6302835 A | 10/1994 |
| JP | 2007263781 A | 10/2007 |
| JP | 2007281051 A | 10/2007 |
| JP | 61-214582 A | 11/2015 |
| WO | 2015038320 A1 | 3/2015 |
| WO | 2017/133016 | 8/2017 |
| WO | 2017/133017 | 8/2017 |
| WO | 2018/133054 | 7/2018 |
| WO | 2018231808 A1 | 12/2018 |
| WO | 2019014866 A1 | 1/2019 |
| WO | 2019160349 A1 | 8/2019 |

OTHER PUBLICATIONS

Office Action issued in CN202180018123.6, dated Jun. 28, 2024, 10 pages.
International Search Report dated May 7, 2021, for PCT/CN2021/075915, 7 pp., including English translation.
Written Opinion of the ISA dated May 7, 2021, for PCT/CN2021/075915, 6 pp., including English translation.

* cited by examiner

PRESSURE-SENSITIVE STRUCTURE AND ELECTRONIC DEVICE

CROSS-REFERENCE TO RELATED APPLICATION

This application is a national phase of PCT patent application Serial No. PCT/CN2021/075915, filed on Feb. 8, 2021, which claims priority to U.S. patent application No. 62/992,000 filed on Mar. 19, 2020 and entitled "hybrid strain sensing system", and claims priority to U.S. patent application No. 63/064,086 filed on Aug. 11, 2020 and entitled "novel hybrid sensing system", the contents each of which are incorporated herein by reference in entirety.

TECHNICAL FIELD

The present application relates to the field of pressure-sensitive structures, and particularly to a pressure-sensitive structure and an electronic device.

BACKGROUND

At present, with the wide use of capacitive screens, electronic devices, especially various components of smart phones, have begun to use touch structures to replace the original mechanical structures (e.g., mobile phone keyboards and home buttons), and thus become electronized and intelligentized gradually. However, traditional mechanical buttons are still used as most of side buttons of smart phones currently due to technology and other reasons. The existence of the traditional mechanical buttons may cause deficiencies including large space occupation of a product, discontinuity in appearance, the difficulty in water resistance and dust prevention, short service life and the difficulty in assembling.

SUMMARY

One objective of the present application is to provide a pressure-sensitive structure which aims to solve a technical problem that the existing touch-sensitive structure has a large space occupation of a device.

In order to solve the technical problem mentioned above, the technical solutions used involved in the embodiments of the present application are described below:

In the first aspect, a pressure-sensitive structure is provided, the pressure-sensitive structure includes:
- a substrate having a first mounting surface and a second mounting surface which are arranged to be opposite to each other;
- a first elastic carrier arranged on the first mounting surface; and
- at least one semiconductor film, where at least one of the semiconductor film is located on the first elastic carrier, and a signal measurement circuit is integrated in the at least one of the semiconductor film. The signal measurement circuit is configured to detect an amount of bending deformation of the substrate and output a recognizable electric signal according to the amount of bending deformation of the substrate detected by the signal measurement circuit.

In the second aspect, an electronic device is provided, the electronic device includes a panel and the aforesaid pressure-sensitive structure, the pressure-sensitive structure is attached to an inner side of the panel.

In the third aspect, an electronic device is provided, the electronic device includes a side frame and the aforesaid pressure-sensitive structure, the pressure-sensitive structure is attached to an inner side of the side frame.

The pressure-sensitive structure provided in the first aspect of the embodiments of the present application has the following beneficial effects: in the pressure-sensitive structure, the first elastic carrier is arranged on the first mounting surface of the substrate, the first elastic carrier is provided with the semiconductor film. When the substrate is deformed, the first elastic carrier is bent and deformed with the deformation of the substrate, the strain signal is amplified by the substrate, the semiconductor film may detect the bending deformation of the substrate and output a recognizable electric signal by the signal measurement circuit integrated in the semiconductor film. In the pressure-sensitive structure, detection elements and the signal measurement circuit are integrated in the semiconductor film, so that the pressure-sensitive structure has a smaller volume and a small space occupation, is high in precision, and is high in reliability and sensitivity.

As compared to the traditional capacitive keys, the pressure-sensitive structure may be applied to pressure keys of an electronic device made of plastic or metal by detecting strain. Furthermore, the pressure-sensitive structure may detect a pressing force. Compared with the existing pressure capacitance, strain gauges or strain films, the pressure-sensitive structure is smaller in size, is more sensitive and more convenient to be used, and can be applied in the electronic devices which has higher requirement on miniaturization and integration, so that mass production can be realized.

Both of the two electronic devices can avoid the conditions including discontinuity in appearance due to traditional mechanical buttons, the difficulty in water resistance and dust prevention, short service life and the difficulty in assembling.

The electronic device provided in the second aspect of the embodiments of the present application has the following beneficial effects: the pressure-sensitive structure is attached to the inner side of the panel of the electronic device. When the panel is pressed, the panel will be bent and deformed, and the substrate generates bending deformation with the deformation of the panel, the semiconductor film detects the bending deformation, and the signal measurement circuit integrated in the semiconductor film outputs a recognizable electric signal. The detection of the pressure value and the pressed position is realized by detecting the strain of the panel.

The electronic device provided in the third aspect of the embodiments of the present application has the following beneficial effects: the pressure-sensitive structure is attached to the frame of the electronic device (especially the side frame of smart phone). When the side frame is pressed, the substrate will be bent and deformed with the deformation of the side frame, the semiconductor film detects the bending deformation, and the signal measurement circuit integrated in the semiconductor film outputs a recognizable electric signal for recognizing the intensity of pressure and the pressed position, thereby realizing a side-touch-key function. There is no need to flute a slot on the side frame of the electronic device separately, so that the electronic device has a concise and elegant appearance.

BRIEF DESCRIPTION OF THE DRAWINGS

In order to describe the embodiments of the present application more clearly, a brief introduction regarding the accompanying drawings that need to be used for describing the embodiments or exemplary technology of the present application is given below; it is apparent that the accompanying drawings described below are only some embodiments of the present application, a person of ordinary skill in the art may also obtain other drawings according to the current drawings without paying creative labor.

EMBODIMENTS OF THE PRESENT INVENTION

Figure 1:
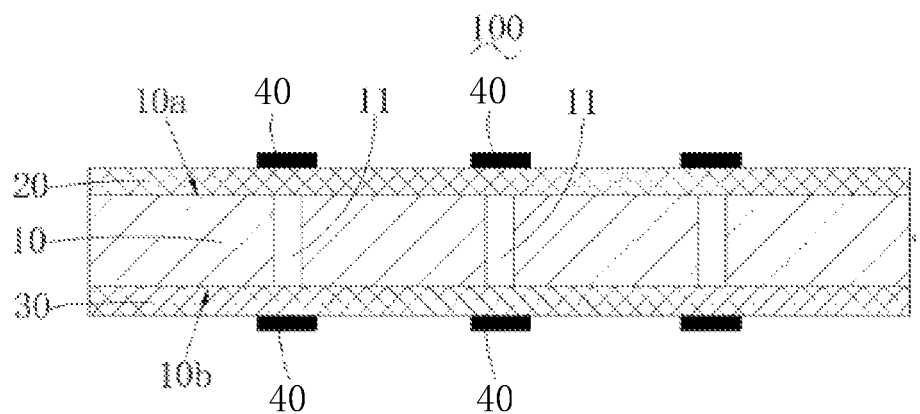
FIG. 1 illustrates a schematic structural diagram of a pressure-sensitive structure provided by the first embodiment of the present application.

In order to make the objective, the technical solutions and the advantages of the present application be clearer and more understandable, the present application will be further described in detail below with reference to the accompanying figures and the embodiments. It should be understood that the embodiments described in detail herein are merely intended to illustrate but not to limit the present application.

It needs to be noted that, when one component is described to be "fixed to" or "arranged on" another component, this component can be directly or indirectly arranged on another component. When it is described that one component "is connected with" another component, this component can be directly or indirectly connected to the another component. Orientation or position relationships indicated by terms including "upper", "lower", "left" and "right" are based on the orientation or position relationships shown in the accompanying figures and is only used for the convenience of description, instead of indicating or implying that the indicated device or element must have a specific orientation and is constructed and operated in a particular orientation, and thus should not be interpreted as limitation to the present application. For the person of ordinary skill in the art, the specific meanings of the aforesaid terms can be interpreted according to specific conditions. Terms of "the first" and "the second" are only for the purpose of describing conveniently and should not be interpreted as indicating or implying relative importance or implicitly indicating the number of indicated technical features. "Multiple/a plurality of" refers to as two or more unless there is an additional explicit and specific limitation. In order to the technical solutions of the present application, the technical solutions of the present application is described in detail with reference to the accompanying figures and the embodiments.

TCR (Temperature Coefficient of Resistance) represents a relative change of a resistance value of a resistance when the temperature is changed by 1° C., and the unit of TCR is ppm/° C. (i.e., 10^-6/° C.). GF (Gauge Factor) of a resistance strain gauge represents a relative change of a resistance of the strain gauge caused due to the strain of the resistance strain gauge. Where, $$GF = \frac{dR/R}{\varepsilon},$$

dR/R represents a resistance change rate, ε represents a mechanical strain of a material; Effective gauge factor (GF_eff) is a ratio of an actual resistance change to an ideal strain when the semiconductor film has no influence on the structural strength. As for a specific structure, the deformation of the structure is determined when an external force is predetermined. However, after a semiconductor film (e.g., silicon) having a large elastic modulus is attached, the deformation of Si is usually smaller than the deformation of the structure of the carrier, the greater the thickness of the film, the smaller the strain deformation of the film, and the corresponding resistance change is decreased. That is, the effective gauge factor is decreased with the increase of the thickness of the film.

Referring to FIG. 1, a pressure-sensitive structure 100 according to the first embodiment of the present disclosure includes a substrate 10 having a first mounting surface 10a and a second mounting surface 10b arranged to be opposite to each other; a first elastic carrier 20 arranged on the first mounting surface 10a, and at least one semiconductor film 40. The at least one semiconductor film 40 is located on the first elastic carrier 20, and a signal measurement circuit is integrated in the at least one semiconductor film 40, the signal measurement circuit is configured to detect a bending deformation of the substrate 10 and output a recognizable electric signal according to the detected bending deformation of the substrate 10.

In the pressure-sensitive structure 100, the first mounting surface 10a of the substrate 10 is provided with the first elastic carrier 20, the first elastic carrier 20 is provided with a semiconductor film 40. When the substrate 10 is deformed, the first elastic carrier 20 is bent and deformed with the deformation of the substrate 10, a strain signal is amplified by the substrate 10. The signal measurement circuit may detect the bending deformation of the substrate 10, and the recognizable electric signal is output by the signal measurement circuit. The pressure-sensitive structure 100 is a sensor structure having a small size, a high precision, a high reliability and a high sensitivity.

As compared to the conventional capacitive keys, the pressure-sensitive structure 100 can be used as a pressure key of a plastic or metal electronic device by detecting strain of the substrate 10. Furthermore, the pressure-sensitive structure 100 may also detect an intensity of a pressing force. Compared with the existing pressure capacitance, the existing strain gauge or the existing strain film, the pressure-sensitive structure 100 is more sensitive and is more convenient to be used, and can be used in an electronic device having a higher structural strength, and a mass deviceion of the electronic device can be realized.

Figure 2:
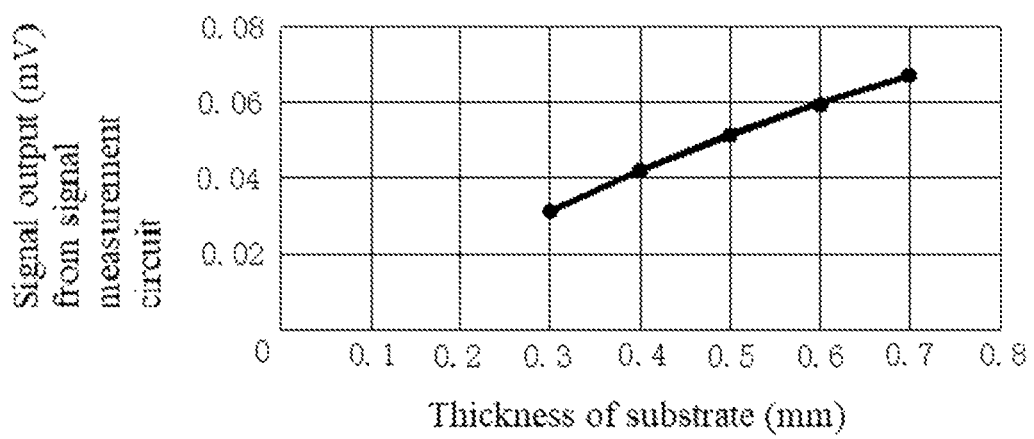
FIG. 2 illustrates a diagram reflecting a correlation between a thickness of the substrate and the signal measurement circuit obtained by finite element simulation.
Figure 3:
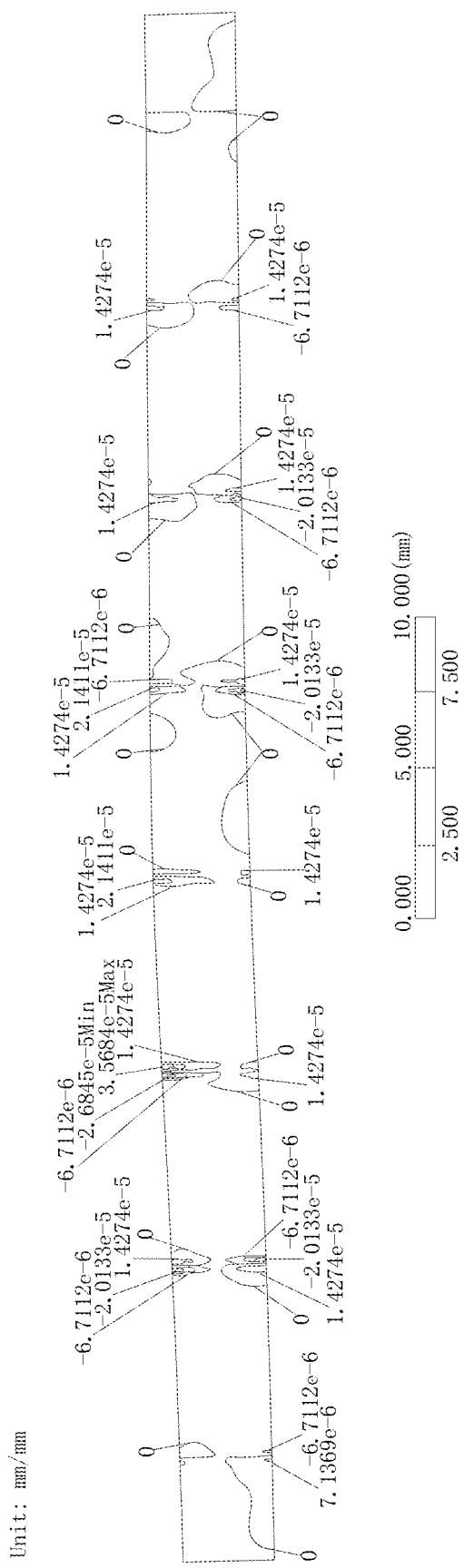
FIG. 3 illustrates a strain simulation diagram of the first elastic carrier obtained by finite element simulation.

The substrate 10 can be made of a material having a characteristic of elastic deformation, the material can be such as metal, glass, fiberglass board, plastic, or other materials. When the pressure-sensitive structure 100 is attached to an inner side of a panel, or an inner side of a side frame or an inner side of other thin-wall member, the substrate 10 may increase the thickness of the whole structure, under the deformation of the same curvature radius of the thin-wall member, the greater the strain of the semiconductor film 40, the greater the corresponding change value ΔR. Thus, a more intensified electric signal can be obtained, and the response of the pressure-sensitive structure 100 to strain is more sensitive. Theoretically, the output signal of the signal measurement circuit in the semiconductor film 40 changes in direct proportion to the thickness of the substrate 10, that is, the thicker the substrate 10, the more sensitive the pressure-sensitive structure 100. As shown in FIG. 2, by simulating the output signals of the signal measurement circuit in the semiconductor film 40 when the substrate 10 has different thicknesses through finite element simulation, it is determined that the correlation between the output signal of the signal measurement circuit of the semiconductor film 40 and the thickness of the substrate 10 is consistent with theoretical result.

Furthermore, the second mounting surface 10b is provided with a second elastic carrier 30, there are at least two semiconductor films 40, at least one of the semiconductor films 40 is located on the first elastic carrier 20, and other one(s) of semiconductor films 40 is/are located on the second elastic carrier 30, and the semiconductor films 40 are arranged to be adjacent to each other. The two mounting surfaces of the substrate 10 are respectively provided with the first elastic carrier 20 and the second elastic carrier 30, each of the first elastic carrier 20 and the second elastic carrier 30 is provided with the semiconductor film 40. When the substrate 10 is deformed, the first elastic carrier 20 and the second elastic carrier 30 are bent and deformed with the deformation of the substrate 10, strain signal is amplified by the substrate 10. The resistance strain gauge may detect the bending deformation of the substrate 10, and the recognizable electric signal is output by the signal measurement circuit in the semiconductor film 40.

Both the first elastic carrier 20 and the second elastic carrier 30 have elastic deformation characteristics for arranging the semiconductor film 40 such as polyimide, flexible circuit board, glass fiber board, polyethylene glycol terephthalate, metal, plastic, or other materials. When the first elastic carrier 20 and the second elastic carrier 30 are all provided with the semiconductor film 40, the difference of strains between the first elastic carrier 20 and the second elastic carrier 30 are detected by the semiconductor films 40 and are processed by the signal measurement circuit, and the recognizable electric signal is output.

Furthermore, the substrate 10 is provided with a strain concentration slot 11, and the semiconductor film 40 is arranged to be adjacent to the strain concentration slot 11. This arrangement makes the pressure-sensitive structure to be prone to be processed, the semiconductor film 40 is arranged adjacent to the strain concentration slot 11, such that the strain can be more concentrated on the area of the elastic carrier more adjacent to the strain concentration slot 11. The semiconductor film 40 can detect the strain of the area of the strain concentration slot 11, a more intensive strain signal can be obtained, and the pressure-sensitive structure 100 can be more sensitive. Referring to the constraint condition of the pressure-sensitive structure 100, eight strain concentration slots are provided on the substrate, a finite element simulation analysis is performed on the first elastic carrier 20. As shown in FIG. 4, the strain of the first elastic carrier 20 is concentrated at the strain concentration slot 11 of the substrate, and the semiconductor film 40 can detect a very intensive strain signal, so that the pressure-sensitive structure 100 is high in precision, is high in reliability and is high in sensitivity. The property of the second elastic carrier 30 is similar to that of the first elastic carrier 20.

Figure 4A:
FIG. 4A-4E illustrate schematic structural diagrams of substrates applied in the pressure-sensitive structure shown in FIG. 1.
Figure 4B:
Figure 4C:
Figure 4D:
Figure 4E:
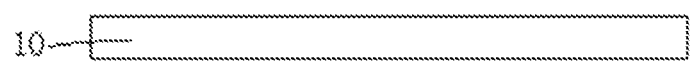

Furthermore, as shown in FIG. 4A, the strain concentration slot 11 is a through slot extending in a direction perpendicular to the first mounting surface 10a. As an alternative, as shown in FIG. 4B, the strain concentration slot 11 is a through slot extending in a direction inclined to the first mounting surface 10a. As an alternative, as shown in FIG. 4C, the strain concentration slot 11 is a through slot having a longitudinal section with a predetermined shape, and the predetermined shape can be a funnel longitudinal section, a circle, or the like. Alternatively, as shown in FIG. 4D, the strain concentration slot 11 is a blind slot having a longitudinal section with a predetermined shape. The blind slot refers to a slot that does not penetrate through the substrate 10. The predetermined shape can be a funnel longitudinal section, a circle, or the like. The semiconductor film 40 is arranged to be adjacent to the strain concentration slot 11, and is configured to amplify the strain signal of the elastic carrier to realize force sensing. Alternatively, as shown in FIG. 4E, the substrate 10 is an integrally-shaped plate, the bending deformation of the substrate 10 is transferred to the first elastic carrier 20 and the second elastic carrier 30. The semiconductor film 40 may detect the bending deformation of the substrate 10, and the signal measurement circuit in the semiconductor film 40 outputs the recognizable electric signal.

The pressure-sensitive structure 100 is applicable to different sensitivity requirements of different occasions by changing the thickness of the substrate 10 and changing the shape of the strain concentrating slot 11.

The semiconductor film 40 includes at least one of a silicon film, a germanium film, a gallium arsenide film, a gallium nitride film, a silicon carbide film, a zinc sulfide film and a zinc oxide film. For example, a silicon film has a very high strain coefficient, however, the silicon film has a great hardness, so that a signal output is greatly reduced when force or strain is transferred to the silicon film. The rigidity of the silicon film can be reduced and the response sensitivity of the silicon film to force or strain can be increased by thinning the silicon film, so that the silicon film can be directly attached to a surface of a material (e.g., a printed circuit board or a flexible circuit board) and configured to measure pressure or strain. A thickness N of a thickest position of the semiconductor film 40 is less than 70 um, or less than 50 um, or less than 30 um, or less than 25 um, or less than 20 um, or less than 15 um, or less than 10 um.

Furthermore, the signal measurement circuit in one semiconductor film 40 has a sensor component that can be used to detect the parameters such as pressure, temperature, and the like.

In some embodiments, the sensor component includes a strain sensing resistance and a measurement circuit of a single resistance, which can detect a resistance value of the single resistance and take the resistance value as a signal output. For example, the resistance can be measured in the manner of Ohmmeter, voltammetry, RC circuit, a RC oscillation circuit, a RLC parallel resonance circuit, as required. The Ohmmeter and the voltammetry are methods of directly measuring resistance, and the corresponding resistance measurement circuit is a conventional technique.

Figure 5:
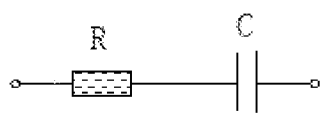
FIG. 5 illustrates a schematic diagram of a signal measurement circuit applied in the pressure-sensitive structure shown in FIG. 1.
Figure 5:
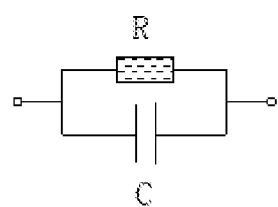

The circuit configuration of this signal measurement circuit is described below:

(1) Referring to FIG. 5, the signal measurement circuit includes a RC circuit constituted of one strain sensing resistance R and one constant capacitance C connected in series or in parallel. The RC circuit is used to measure the resistance, and the time constant of the RC circuit is expressed as τ=RC. According to this formula, when the amount of the capacitance of the capacitance C is known, the resistance value R can be inversely calculated according to the measured time constant τ.

Figure 6:
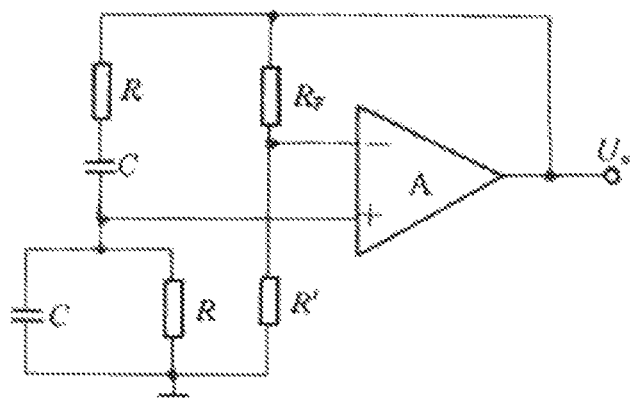
FIG. 6 illustrates another schematic diagram of the signal measurement circuit applied in the pressure-sensitive structure shown in FIG. 1.

As shown in FIG. 6, the signal measurement circuit includes a strain sensing resistance R, a constant capacitance C and an amplifier. The RC series-parallel frequency selection network and the amplifier are combined, and an integrated operational amplifier can be used as the amplifier. The RC series-parallel frequency selection network is connected between an output and a non-inverting input of the operational amplifier to be constituted as a positive feedback circuit, and $R_f$, R' are connected between the output of the operational amplifier and an inverting input of the operational amplifier to be constituted as a negative feedback circuit. The positive feedback circuit and the negative feedback circuit are constituted as a Venturi bridge oscillation circuit, the input and the output of the operational amplifier cross two diagonal lines of the bridge respectively. An output frequency of the Venturi bridge oscillation circuit is expressed as $$f_o = \frac{1}{2\pi RC_1}.$$

The frequency $f_0$ is very sensitive to changes of the resistance value R. According to this formula, when the amount of capacitance of the capacitance C is known, the resistance value R can be inversely calculated through the measured frequency $f_0$.

Figure 7:
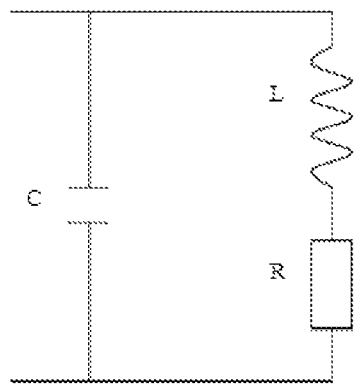
FIG. 7 illustrates another schematic diagram of the signal measurement circuit applied in the pressure-sensitive structure shown in FIG. 1.

Referring to FIG. 7, the signal measurement circuit includes one strain sensing resistance R, one constant inductance L and one constant capacitance C. The RLC resonant circuit is a circuit constituted by connecting one RL series circuit with the capacitance C in parallel. An angular frequency of the RLC resonant circuit is expressed as $$\omega = \sqrt{\frac{1}{LC} - \left(\frac{R}{L}\right)}.$$

According to the formula listed above, when the inductance amount of the inductance L and the capacitance amount of the capacitance $C_1$ are known, the value of the resistance R can be calculated according to the measured angular frequency ω.

The sensor component includes two resistances. For example, the sensor component includes a voltage dividing circuit which is constituted by connecting a strain sensing resistance and a reference resistance in series. As an alternative, the sensor component includes a voltage dividing circuit constituted by connecting two strain sense resistances in series. As an alternative, the sensor component includes one shunt circuit constituted by connecting one strain sensing resistance and one reference resistance in parallel. As an alternative, the sensor component includes one shunt circuit constituted by connecting two strain sense resistances in parallel.

In one embodiment, when the signal measurement circuit includes one series voltage dividing circuit or one parallel shunt circuit constituted of two strain sense resistances, one of the strain sense resistances is a positive strain coefficient sensing resistance, and the other one is a negative strain coefficient sensing resistance. As an alternative, the two sense resistances have different strain coefficients.

Figure 8:
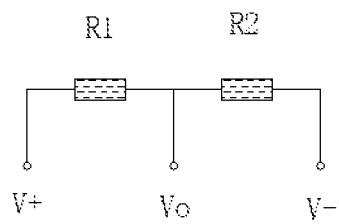
FIG. 8 illustrates another schematic diagram of the signal measurement circuit applied in the pressure-sensitive structure shown in FIG. 1.

The circuit configuration of this signal measurement circuit is described below:

referring to FIG. 8, two resistances are constituted as one series voltage-dividing circuit. A constant-voltage source is used to impose an input voltage Ui between a power terminal V+ and a power terminal V−, a potential of a terminal Vo is detected, or an output voltage Uo between the terminal Vo and a GND terminal is measured, an input/output voltage formula is expressed as $$U_o = \frac{R_2}{R_1 + R_2} U_i,$$

where $R_1$ and $R_2$ are the resistances of the strain sense resistances R1 and R2, respectively.

Figure 9:
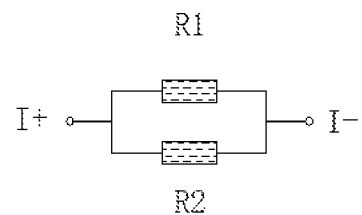
FIG. 9 illustrates another schematic diagram of the signal measurement circuit applied in the pressure-sensitive structure shown in FIG. 1.

Referring to FIG. 9, two resistances are constituted as the parallel shunt circuit. A constant current source is used to input a current I between an end I+ and an end I−, an output current $I_1$ on a branch R1 is measured, and an input/output current formula is expressed as $$I_1 = \frac{R_2}{R_1 + R_2} I.$$

Figure 10:
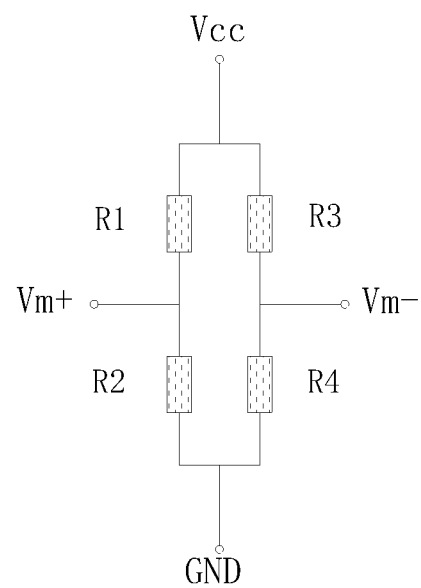
FIG. 10 illustrates another schematic diagram of the signal measurement circuit applied in the pressure-sensitive structure shown in FIG. 1.

Referring to FIG. 10, the sensor component includes four resistances R1, R2, R3 and R4, where the sensor component can be a Wheatstone bridge constituted by electrically connecting one strain sensing resistance with three reference resistances. As an alternative, the sensor component includes a half-bridge circuit constituted by electrically connecting two strain sense resistances with two reference resistances. As an alternative, the sensor component includes a full-bridge circuit constituted by electrically connecting four strain sense resistances. As an alternative, the sensor component includes a bridge circuit constituted by electrically connecting three strain sense resistances and one reference resistance.

In one embodiment, in the bridge circuit constituted of four strain sense resistances, two strain sense resistances are sense resistances having positive strain coefficient, and other two strain sense resistances are negative strain coefficient sense resistances; as an alternative, the four resistances have different strain coefficients.

The circuit configuration of the signal measurement circuit is described below:

the bridge circuit is constituted by four resistances, as shown in FIG. 10, an output voltage formula is expressed as $$U_o = \frac{R_2R_3 - R_1R_4}{(R_1 + R_2)(R_3 + R_4)} U_i,$$

where $R_3$ and $R_4$ are the resistances of the strain sense resistances R3 and R4, respectively.

Where, $U_i$ represents voltage $V_{CC}$, $U_0$ is voltage difference between Vm+ and Vm−. In addition, in the full-bridge circuit constituted by electrically connecting the four strain sense resistances. There are many methods for the selection of the four strain sense resistances, a requirement that $U_0$ in the formula changes when the deformation is generated only needs to be met. Where there are several typical methods, which are described below:

Resistances R1 and R4 are sense resistances having positive strain coefficient, R2 and R3 are sense resistances having negative strain coefficient; alternatively, R1 and R4 are sense resistances having negative strain coefficient, R2 and R3 are sense resistances having positive strain coefficient. Alternatively, resistances R1 and R4 are sense resistances having positive (or negative) strain coefficient, resistances R2 and R3 are sense resistances zero strain coefficient.

Furthermore, the semiconductor film 40 can be further provided with a temperature sensor, the sensor component further includes the temperature sensor, where the temperature sensor is configured to detect a temperature of a position where is it located, and output a temperature detection signal. The temperature sensor can be configured to detect a local temperature, and may also be configured to use temperature information to perform output signal compensation on structural expansion which is caused due to temperature, so that the semiconductor film 40 can output a deformation signal, and can also output a temperature signal.

Furthermore, the signal measurement circuit further includes an amplification circuit connected to the sensor component and configured to amplify the signal output by the sensor component. Furthermore, the signal measurement circuit further includes a compensation circuit, where an input of the compensation circuit is coupled to an output of the amplification circuit, and the compensation circuit is configured to compensate an out-of-balance voltage output by the sensor component according to a signal output by the amplification circuit.

The condition of attaching the pressure-sensitive structure 100 to the inner side of the panel, the condition of attaching the pressure-sensitive structure 100 to the inner side of the side frame and the condition of attaching the pressure-sensitive structure 100 to the inner side of other thin-walled member are similar. The pressure-sensitive structure 100 is described by taking the condition that the pressure-sensitive structure 100 is attached to the panel 201 through the colloid 203, and the signal measurement circuit in the semiconductor film 40 includes the full bridge constituted of four electrically connected strain sense resistances R1, R2, R3 and R4 as example. Compared with other existing sensor structures, the pressure-sensitive structure 100 has a lower dependency on the colloid 203, and the pressure-sensitive structure 100 can eliminate errors caused due to differences of adhesives of the colloid 203. Thus, the pressure-sensitive structure 100 has accurate and reliable measurement.

When the panel 201 is pressed, the panel 201 will generate downward bending deformation, the pressure-sensitive structure 100 will deform with the deformation of the panel 201 through the colloid 203, thereby causing deformation of the strain sense resistances R1, R2, R3, and R4, and thereby causing change of resistance values of the strain sense resistances R1, R2, R3 and R4. Due to the downward bending deformation of the panel 201, a tensile deformation is generated at the lower surface of the panel 201. Regarding the selected colloid 203, the ratio of the width to the thickness is at least 50:1, and the amount of deformation of the colloid 203 in the longitudinal direction is far less than the amount of deformation of the colloid 203 in the horizontal direction since the horizontal dimension of the colloid 203 is greater than the longitudinal dimension of the colloid 203.

Furthermore, the semiconductor film 40 of the first elastic carrier 20 is located on a side of the first elastic carrier 20 facing the substrate 10, or the semiconductor film 40 of the first elastic carrier 20 is located on a side of the first elastic carrier 20 being away from the substrate 10. At least one of the two arrangements of the semiconductor film 40 of the first elastic carrier 20 is selected. The semiconductor film 40 of the second elastic carrier 30 is located on a side of the second elastic carrier 30 facing the substrate 10, and the semiconductor film 40 of the second elastic carrier 30 is located on a side of the second elastic carrier 30 being away from the substrate 10. At least one of the two arrangements of the semiconductor film 40 of the second elastic carrier 30 is selected. The semiconductor film 40 can be distributed on one side or two sides of the corresponding elastic carrier, and the semiconductor film 40 can be distributed on either side of the corresponding elastic carrier and form the signal measurement circuit in the corresponding semiconductor film 40.

Furthermore, there are at least two semiconductor films 40, and the semiconductor films 40 are distributed on the substrate 10 in an array. According to the arrangement of the semiconductor films 40, force sensing can be performed on multiple positions, gesture recognition and sliding functions, which cannot be implemented by mechanical buttons, can be implemented through algorithm.

Furthermore, two strain sense resistances in the signal measurement circuit in the semiconductor film 40 are coincided in one-to-one correspondence manner. Alternatively, two strain sense resistances of the signal measurement circuit in the semiconductor film 40 are distributed in a staggered manner. Some or all of the semiconductor film 40 can be distributed at the position adjacent to the strain concentration slot 11 as desired.

Figure 11:
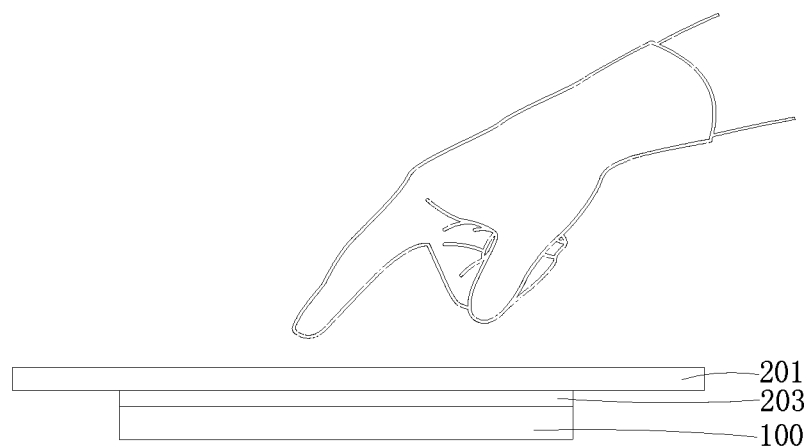
FIG. 11 illustrates one schematic structural diagram of the pressure-sensitive structure shown in FIG. 1 applied to a panel, when the pressure-sensitive structure is not pressed.
Figure 12:
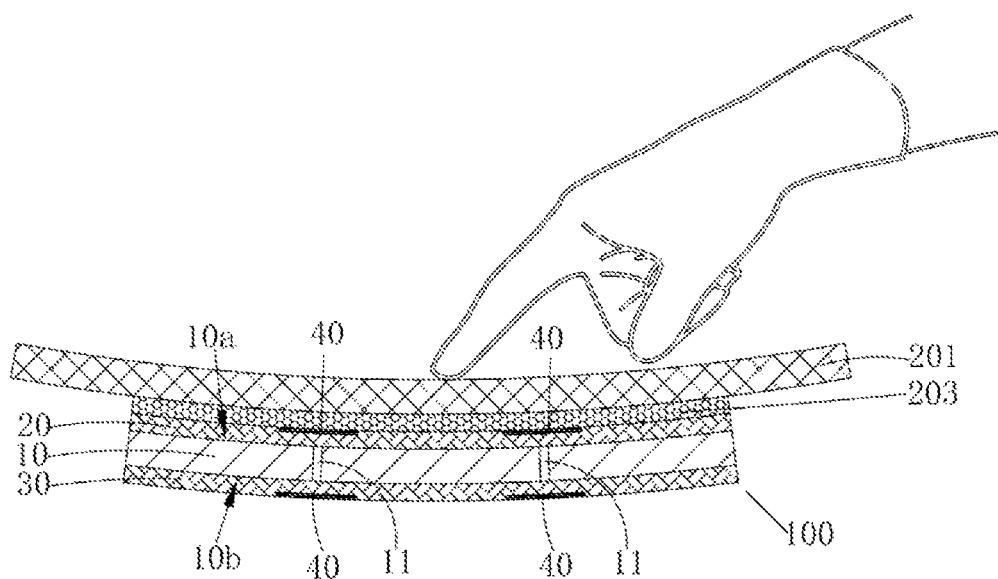
FIG. 12 illustrates another schematic structural diagram of the pressure-sensitive structure shown in FIG. 4 applied to the panel, when the pressure-sensitive structure is pressed.

Referring to FIG. 11 and FIG. 12, an electronic device according to the first embodiment of the present application includes a panel 201 and the aforesaid pressure-sensitive structure 100. The pressure-sensitive structure 100 is attached to an inner side of the panel 201.

The pressure-sensitive structure 100 is attached to the inner side of the panel 201 of the electronic device. When the panel 201 is pressed, the panel 201 is bent and deformed, and enables the substrate 10 to generate bending deformation, the strain sense resistances detect the bending deformation, and the signal measurement circuit in the semiconductor film 40 outputs the recognizable electric signal. The detection of the pressure force and the pressed position is achieved by detecting the strain of the panel 201. The electronic device can avoid the problems including discontinuous appearance due to the traditional mechanical buttons, the difficulty in water resistance and dust prevention, short service life and the difficulty in assembling.

The panel 201 may be a touch screen having a rigid structure, or be a display, or be other electronic device. By connecting the pressure-sensitive structure 100 with the panel 201, not only the touched position can be accurately recognized, the value of the touch pressure can also be accurately recognized, and an application space of the electronic device on product application, human-computer interaction and user experience is expanded. By touching a touch screen, a display, or an electronic device by a user, a precise pressure level and a measurement of pressure can be obtained directly. After correction, a precise pressure value generated by pressing can be obtained.

Furthermore, the pressure-sensitive structure 100 and the panel 201 are connected through a colloid 203, welding or other mechanical connection. When using the colloid 203, the colloid is used when it is adhered, it is convenient to use the colloid 203, the process of assembling is simplified, and rework is facilitated. When the user's finger is pressed on the panel 201, the panel 201 is bent and deformed, and the colloid 203 enables the pressure-sensitive structure 100 to be deformed, the position to be pressed and the intensity of pressure are obtained, a pressure-sensitive touch-control function is realized. The colloid 203 is a hydrogel or a double-sided adhesive.

Figure 13:
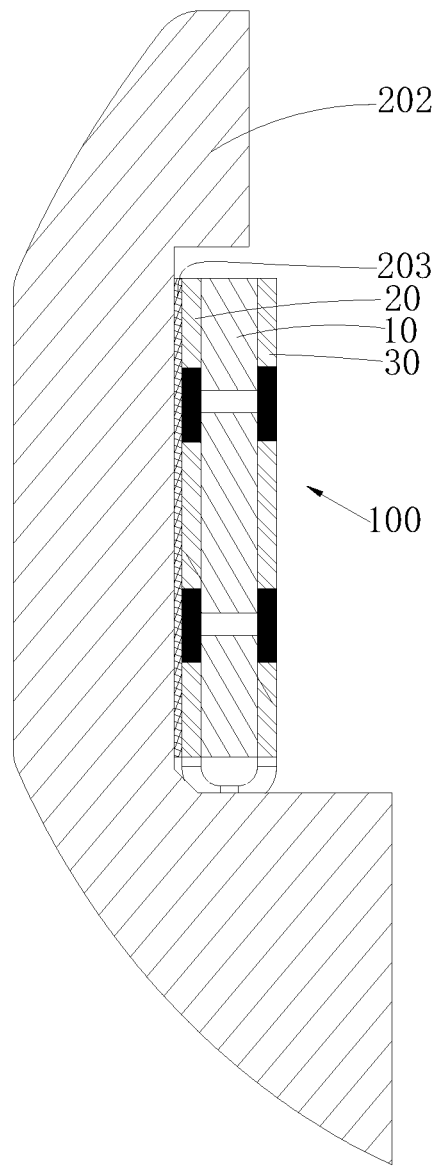
FIG. 13 illustrates a schematic diagram of the pressure-sensitive structure shown in FIG. 1, when the pressure-sensitive structure is applied to a side frame.

Referring to FIG. 13, an electronic device according to a second embodiment of the present application includes a side frame 202 and the aforesaid pressure-sensitive structure 100. The pressure-sensitive structure 100 is attached to an inner side of the side frame 202.

The pressure-sensitive structure 100 is attached to the side frame 22 of the electronic device, especially on a side frame of a smart phone. When the side frame 202 is pressed, the substrate 10 is bent and deformed with the deformation of the side frame 202, the strain sense resistances detect the bending deformation, and the signal measurement circuit in the semiconductor film 40 outputs a recognizable electric signal for recognizing the pressed position and the intensity of the pressure, so that a touch-key-function of the side frame 22 is realized, and there is no need to flute a slot on the side frame 202 of the electronic device, so that the appearance of the electronic product is simple and elegant. The electronic device can avoid the conditions including discontinuous appearance due to the traditional mechanical buttons, the difficulty in water resistance and dust prevention, short service life and the difficulty in assembling.

Furthermore, the pressure-sensitive structure 100 and the side frame 202 are connected through the colloid 203, welding or other mechanical connections. During using of the colloid 203, the colloid 203 is used when it is adhered, it is convenient to use the colloid 203, the process of assembling is simplified, and rework is facilitated. The colloid 203 is a hydrogel or a double-sided adhesive.

It can be understood that, the pressure-sensitive structure 100 can also be attached to the inner side of other thin-walled members. When the thin-walled member is pressed, the thin-walled member can generate bending deformation and enables the substrate to generate bending deformation, the strain sense resistances detect the bending deformation, and the signal measurement circuit outputs the recognizable electric signal according to the detection of the bending deformation. The detection of the pressure and the pressed position is achieved by detecting the strain of the thin-walled member.

Furthermore, the pressure-sensitive structure and the thin-walled member are connected through glue, welding or other mechanical connections. During using of the colloid, the colloid is used when it is adhered, it is convenient to use the colloid 203, the process of assembling is simplified, and rework is facilitated. The colloid is a hydrogel or a double-sided adhesive.

The foregoing only describes preferable embodiments of the present application, and should not be regarded as limitations to the present application. All modifications, equivalent replacements and improvements which are made within the spirit and the principle of the present application should all be included in the protection scope of the present application.

What is claimed is:

1. A pressure-sensitive structure, comprising:
   a substrate having a first mounting surface and a second mounting surface which are arranged to be opposite to each other;
   a first elastic carrier arranged on the first mounting surface of the substrate; and
   a first semiconductor film disposed on the first elastic carrier, the first semiconductor film having multiple components integrated therein, the multiple components connected together to form a signal measurement circuit configured to detect an amount of bending deformation of the substrate and the first elastic carrier and to output a recognizable electric signal corresponding to the amount of bending deformation of the substrate and the first elastic carrier detected by the signal measurement circuit, wherein the signal measurement circuit comprises:
   a RC circuit composed of one strain sensing resistance and one constant capacitance connected in series or in parallel integrated into the thin film; or
   a resonant circuit composed of one strain sensing resistance, one constant inductance and one constant capacitance integrated into the thin film; or
   a shunt circuit composed of one strain sensing resistance and one reference resistance connected in parallel integrated into the thin film; or
   a shunt circuit composed of two strain sense resistances connected in parallel integrated into the thin film; or
   a half bridge circuit constituted by electrically connecting two strain sense resistances and two reference resistances integrated into the thin film.

2. The pressure-sensitive structure according to claim 1, wherein a second elastic carrier is arranged on the second mounting surface, and the pressure-sensitive structure additionally comprises a second semiconductor film arranged on the second elastic carrier, wherein the first and second semiconductor films are arranged adjacent to each other.

3. The pressure-sensitive structure according to claim 2, wherein the first semiconductor film is arranged on the first elastic carrier and is located on a surface of the first elastic carrier facing the substrate or is located on a surface of the first elastic carrier facing away from the substrate; the second semiconductor film being arranged on the second elastic carrier and located on a surface of the second elastic carrier facing the substrate or located on a surface of the second elastic carrier being facing away from the substrate.

4. The pressure-sensitive structure according to claim 1, wherein the first semiconductor film comprises a silicon film, or a germanium film, or a gallium arsenide film, or a gallium nitride film, or a silicon carbide film, or a zinc sulfide film, or a zinc oxide film.

5. The pressure-sensitive structure according to claim 1, wherein a thickness n of the first semiconductor film is less than 70 um.

6. The pressure-sensitive structure according to claim 1, wherein a strain concentration slot is arranged on the substrate, and the first semiconductor film is arranged adjacent to the strain concentration slot.

7. The pressure-sensitive structure according to claim 6, wherein the strain concentration slot is a through slot extending in a direction perpendicular to the first mounting surface.

8. The pressure-sensitive structure according to claim 1, wherein the multiple components integrated into the first semiconductor film further comprise a temperature sensor configured to detect a temperature of a position where it is located and output a temperature detection signal.

9. The pressure-sensitive structure according to claim 1, wherein the signal measurement circuit further comprises an amplification circuit connected to a sensor and configured to amplify a signal output by the sensor.

10. The pressure-sensitive structure according to claim 9, wherein the signal measurement circuit further comprises a compensation circuit, wherein an input of the compensation circuit is coupled to an output of the amplification circuit, and the compensation circuit is configured to compensate an out-of-balance voltage output by the sensor according to a signal output by the amplification circuit.

11. An electronic device, comprising a panel and the pressure-sensitive structure according to claim 1, wherein the pressure-sensitive structure is attached to an inner side of the panel.

12. The electronic device according to claim 11, wherein the pressure-sensitive structure and the panel are connected through glue or welding.

13. An electronic device, comprising a side frame and the pressure-sensitive structure according to claim 1, wherein the pressure-sensitive structure is attached to an inner side of the side frame.

14. The electronic device according to claim 13, wherein the pressure-sensitive structure and the side frame are connected through glue or welding.

15. The pressure-sensitive structure according to claim 6, wherein the strain concentration slot is a through slot extending in a direction inclined to the first mounting surface.

16. The pressure-sensitive structure according to claim 6, wherein the strain concentration slot is a through slot having a longitudinal section with a predetermined shape.

17. The pressure-sensitive structure according to claim 6, wherein the strain concentration slot is a blind slot having a longitudinal section with a predetermined shape.

18. The pressure-sensitive structure according to claim 1, wherein the multiple components include a capacitor and/or an inductor.

19. The pressure-sensitive structure according to claim 1, wherein the multiple components include a voltage divider.

20. The pressure-sensitive structure according to claim 1, wherein the multiple components include a reference resistor and a deformation sensing resistor.

* * * * *